United States Patent
Lee et al.

(10) Patent No.: US 9,080,850 B2
(45) Date of Patent: Jul. 14, 2015

(54) TOUCH AND PROXIMITY SENSING DEVICE

(71) Applicant: ENE Technology Inc., Hsin-Chu (TW)

(72) Inventors: Chao-Ming Lee, Hsin-Chu (TW); King-Lien Lee, Taipei (TW)

(73) Assignee: Ene Technology Inc., Hsin-Chu (TW)

(*) Notice: Subject to any disclaimer, the term of this patent is extended or adjusted under 35 U.S.C. 154(b) by 369 days.

(21) Appl. No.: 13/790,080

(22) Filed: Mar. 8, 2013

(65) Prior Publication Data

US 2014/0097768 A1   Apr. 10, 2014

(30) Foreign Application Priority Data

Oct. 5, 2012  (TW) .............................. 101136904 A

(51) Int. Cl.
| | | |
|---|---|---|
| G06F 3/045 | (2006.01) | |
| G01B 7/14 | (2006.01) | |
| H05B 37/02 | (2006.01) | |
| H03K 17/955 | (2006.01) | |
| H03K 17/96 | (2006.01) | |

(52) U.S. Cl.
CPC ............ *G01B 7/14* (2013.01); *H03K 17/955* (2013.01); *H03K 17/9622* (2013.01); *H05B 37/0227* (2013.01); *H03K 2217/96023* (2013.01); *H03K 2217/960765* (2013.01)

(58) Field of Classification Search
CPC ....... G06F 3/044; G01B 7/14; H05B 37/0227
USPC .......... 315/313, 250, 297; 345/174, 173, 157, 345/161, 163, 177, 169; 324/686, 679; 327/517
See application file for complete search history.

(56) References Cited

U.S. PATENT DOCUMENTS

| | | | | |
|---|---|---|---|---|
| 2004/0155871 | A1* | 8/2004 | Perski et al. ................... | 345/174 |
| 2010/0259503 | A1* | 10/2010 | Yanase et al. .................. | 345/174 |
| 2012/0223911 | A1* | 9/2012 | Westhues ...................... | 345/174 |
| 2014/0240285 | A1* | 8/2014 | Hermes .......................... | 345/174 |
| 2014/0306926 | A1* | 10/2014 | Lee ................................ | 345/174 |

* cited by examiner

Primary Examiner — Lincoln Donovan
Assistant Examiner — Thomas Skibinski
(74) Attorney, Agent, or Firm — SmithAmundsen LLC; Kelly J. Smith; Dennis S. Schell

(57) ABSTRACT

A touch and proximity sensing device includes a circuit board and a sensed signal processing unit including only one sensed signal conversion engine. The circuit board includes a capacitor sensing electrode and a grounding conductor foil disposed on opposite surfaces of the circuit board, and has a proximity sensing electrode formed thereon. The grounding conductor foil is spaced apart from the proximity sensing electrode in a planar direction parallel to the surfaces of the circuit board. The sensed signal conversion engine is spaced apart from the capacitor sensing electrode and the proximity sensing electrode in the planar direction and detects electric sensed signals from the capacitor sensing electrode and the proximity sensing electrode.

17 Claims, 9 Drawing Sheets

TOUCH AND PROXIMITY SENSING DEVICE

CROSS-REFERENCE TO RELATED APPLICATION

This application claims priority to Taiwanese Application No. 101136904, filed on Oct. 5, 2012.

BACKGROUND OF THE INVENTION

1. Field of the Invention

The invention relates to a touch and proximity sensing device, and more particularly to a touch and proximity sensing device using only one sensed signal conversion engine.

2. Description of the Related Art

Conventionally, a traditional mechanical button device applied to electronic products uses mechanical buttons to control activation and deactivation of an electrical circuit.

With progress of technology, the traditional mechanical buttons which are bulky and require individual assembly have become unsuited for use in a current electronic product which tends to be light, thin, short, and small. Moreover, touch sensing techniques have become mature, and traditional mechanical buttons are gradually being replaced by sensing buttons in electronic products.

Two types of conventional touch and proximity sensing devices are described hereinbelow.

Referring to FIGS. 1 to 3, a first type of the touch and proximity sensing devices includes a circuit board 11 and two sensed signal processing units 12. Each sensed signal processing unit 12 includes a sensed signal conversion engine 121 disposed on a bottom surface of the circuit board 11. Each sensed signal processing unit 12 may be a signal processing chip. The circuit board 11 includes a substrate 111, a plurality of capacitor sensing electrodes 112, a proximity sensing electrode 113, and a grounding conductive film 114. The capacitor sensing electrodes 112 and the proximity sensing electrode 113 are disposed on a top surface of the substrate 11, and the sensed signal conversion engines 121 and the grounding conductive film 114 are disposed on the bottom surface of the substrate 111. One of the sensed signal conversion engines 121 is coupled to the capacitor sensing electrodes 112, and the other one of the sensed signal conversion engine 121 is coupled to the proximity sensing electrode 113. The grounding conductive film 114 is correspondingly disposed under the capacitor sensing electrodes 112 and the proximity sensing electrode 113.

External electric power is provided to the capacitor sensing electrodes 112 and the proximity sensing electrode 113 via the sensed signal conversion engines 121. When one of the capacitor sensing electrodes 112 is touched or a finger is located in a sensing range of the proximity sensing electrode 113, one of the sensed signal conversion engines 121 detects variation of an electric signal from said one of the capacitor sensing electrodes 112, or the other one of the sensed signal conversion engines 121 detects variation of an electric signal from the proximity sensing electrode 113. Then, execution of relevant external process is driven through the sensed signal conversion engine 121, such as turning on light emitting diodes disposed on the circuit board 11 (not shown).

Since the signals from the capacitor sensing electrodes 112 and the proximity sensing electrode 113 easily interfere with each other, the first type of the touch and proximity sensing devices separately processes the two different kinds of the signals using two independent sensed signal conversion engines 121 to reduce interference level therebetween, so that the sensed signal processing unit 12 must include two independent sensed signal conversion engines 121.

Referring to FIGS. 1, 4, and 5, the second type of the touch and proximity sensing devices includes a circuit board 11 and a sensed signal processing unit 13 disposed on a bottom surface of the circuit board 11. The sensed signal processing unit 13 includes a sensed signal conversion engine 131 and a microcontroller 132 coupled to the sensed signal conversion engine 131. The sensed signal processing unit 13 may be a signal processing chip. The circuit board 11 includes a substrate 111, a plurality of capacitor sensing electrodes 112, a proximity sensing electrode 113, and a grounding conductive film 114. The capacitor sensing electrodes 112 and the proximity sensing electrode 113 are disposed on a top surface of the substrate 111, and the grounding conductive film 114 is disposed on the bottom surface of the substrate 111. The microcontroller 132 is also coupled to the capacitor sensing electrodes 112 and the proximity sensing electrode 113. The grounding conductive film 114 is correspondingly disposed under the capacitor sensing electrodes 112 and the proximity sensing electrode 113.

When external electric power is provided to the sensed signal processing unit 13, the sensed signal conversion engine 131 is controlled by the microcontroller 132 to continuously switch for alternatively receiving signals from the capacitor sensing electrodes 112 or from the proximity sensing electrode 113. When one of the capacitor sensing electrodes 112 is touched or a finger is located in a sensing range of the proximity sensing electrode 113, the sensed signal conversion engine 131 detects variation of an electric signal, which has a magnitude greater than a predetermined threshold value, from said one of the capacitor sensing electrodes 112, or the proximity sensing electrode 113. Then, execution of relevant external process is driven, such as turning on light emitting diodes disposed on the circuit board (not shown).

The sensed signal conversion engine 131 of the second type of the touch and proximity sensing devices is controlled by the microcontroller 132 to switch between a first mode of receiving electric signal from the capacitor sensing electrodes 112 and a second mode of receiving electric signal from the proximity sensing electrode 113, so as to reduce interference level between two different kinds of signals.

However, the first type of the touch and proximity sensing devices requires a lot of area on the circuit board 11 for placement of the two signal processing chips that respectively have a sensed signal conversion engine 121. Even though the two sensed signal engines 121 may be integrated in a signal processing chip, it results in a higher cost and a larger volume of the signal processing chip. The second type of the touch and proximity sensing devices requires a microcontroller 132 embedded in the signal processing chip, and a complicated firmware is required to be written in the signal processing chip for enabling the sensed signal conversion engine 131 to switch between the first and second modes. The additional cost attributed to the microcontroller 132 is thus added to the cost of the second type of the touch and proximity sensing devices. Furthermore, the complicated firmware may have errors, and the continuous switching may result in higher power consumption and heat dissipation issues.

SUMMARY OF THE INVENTION

Therefore, an object of the present invention is to provide a touch and proximity sensing device that has a relatively smaller number of components.

According to one aspect of the present invention, a touch and proximity sensing device comprises:

a circuit board including:
  a dielectric substrate having opposite first and second surfaces, the first surface having a first region and a second region spaced apart from the first region, the second surface having a third region and a fourth region spaced apart from the third region, the third region overlapping with a projection of the first region onto the second surface, the fourth region overlapping with a projection of the second region onto the second surface;
  at least one capacitor sensing electrode formed on the first region;
  a grounding conductor foil formed on the third region; and
  a proximity sensing electrode formed on one of the second and fourth regions; and
a sensed signal processing unit disposed on the dielectric substrate and including:
  at least one capacitance sensing port coupled to the capacitor sensing electrode;
  a proximity sensing port coupled to the proximity sensing electrode; and
  a sensed signal conversion engine coupled to the capacitance sensing port and the proximity sensing port and operable to detect an electric sensed signal from at least one of the capacitor sensing electrode and the proximity sensing electrode, and to output an output signal based on the electric sensed signal;
wherein the sensed signal conversion engine is disposed at one of:
  the first surface of the dielectric substrate at a position spaced apart from the first and second regions; and
  the second surface of the dielectric substrate at a position spaced apart from the third and fourth regions.

Another object of the present invention is to provide a circuit board adapted for use in the touch and proximity sensing device of this invention.

According to another aspect of the present invention, a circuit board is adapted for placement of a sensed signal processing unit thereon. The sensed signal processing unit includes a capacitance sensing port and a proximity sensing port for touch and proximity sensing, and the circuit board comprises:
  a dielectric substrate having opposite first and second surfaces, the first surface having a first region and a second region spaced apart from the first region, the second surface having a third region and a fourth region spaced apart from the third region, the third region overlapping with a projection of the first region onto the second surface, the fourth region overlapping with a projection of the second region onto the second surface;
  at least one capacitor sensing electrode formed on the first region and to be coupled to the capacitance sensing port;
  a grounding conductor foil formed on the third region;
  a proximity sensing electrode formed on the second region and to be coupled to the proximity sensing port; and
  an auxiliary proximity sensing electrode formed on the fourth region and to be coupled to the proximity sensing port.

BRIEF DESCRIPTION OF THE DRAWINGS

Other features and advantages of the present invention will become apparent in the following detailed description of the preferred embodiments with reference to the accompanying drawings, of which.

DETAILED DESCRIPTION OF THE PREFERRED EMBODIMENTS

Figure 1:
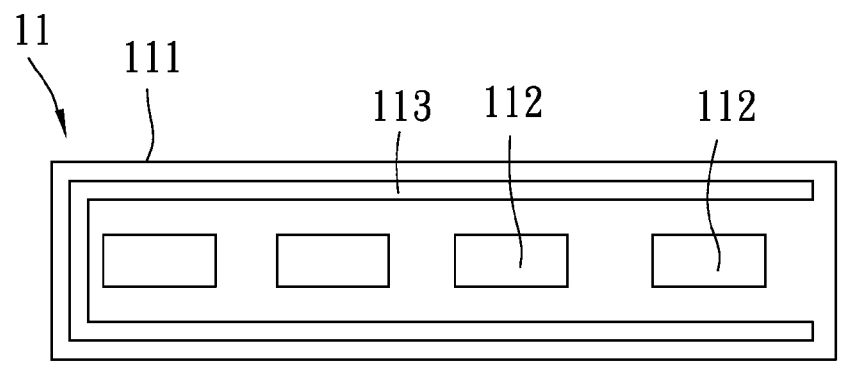
FIG. 1 is a schematic top view of a circuit board of either a first type or a second type of conventional touch and proximity sensing devices.
Figure 2:
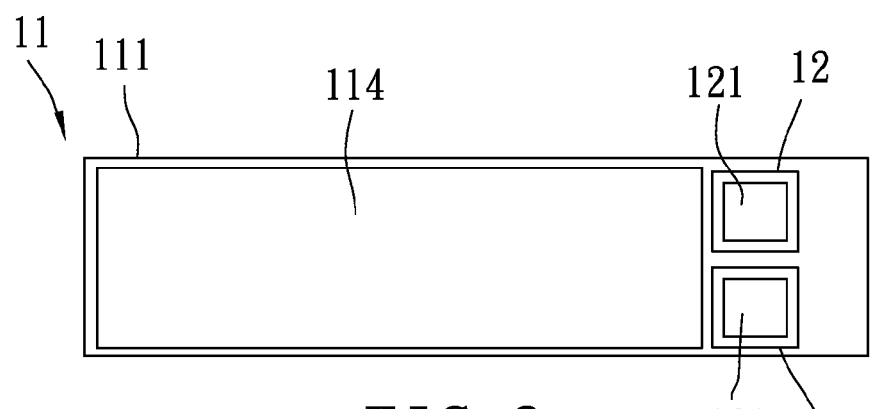
FIG. 2 is a schematic bottom view of the circuit board of the first type of the conventional touch and proximity sensing devices.
Figure 3:
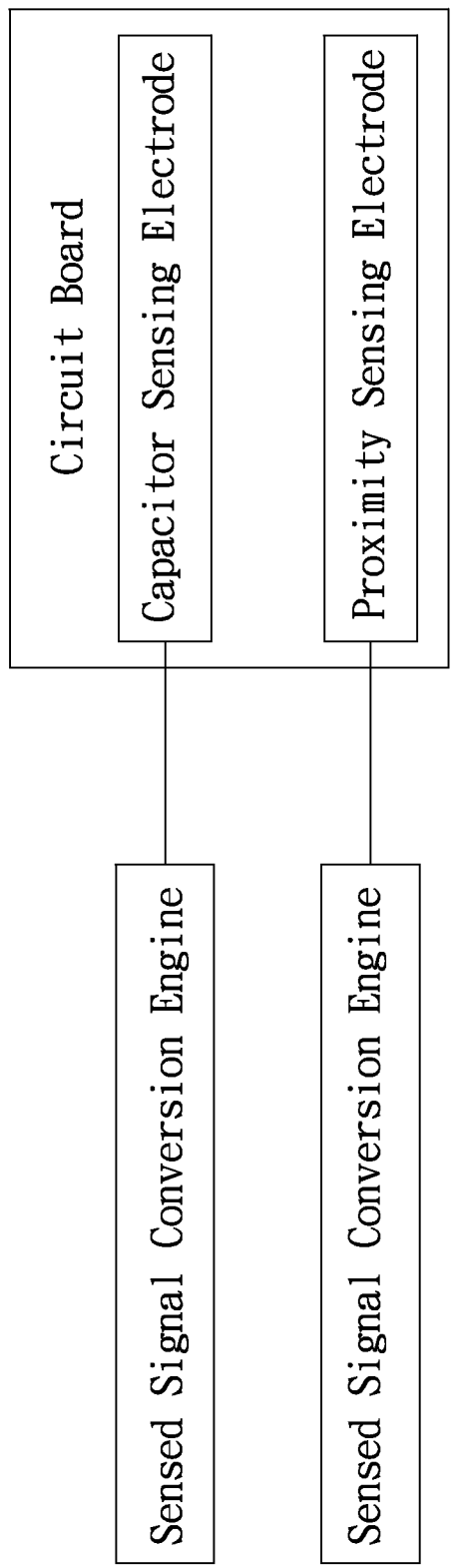
FIG. 3 is a block diagram illustrating the first type of the touch and proximity sensing device.
Figure 4:
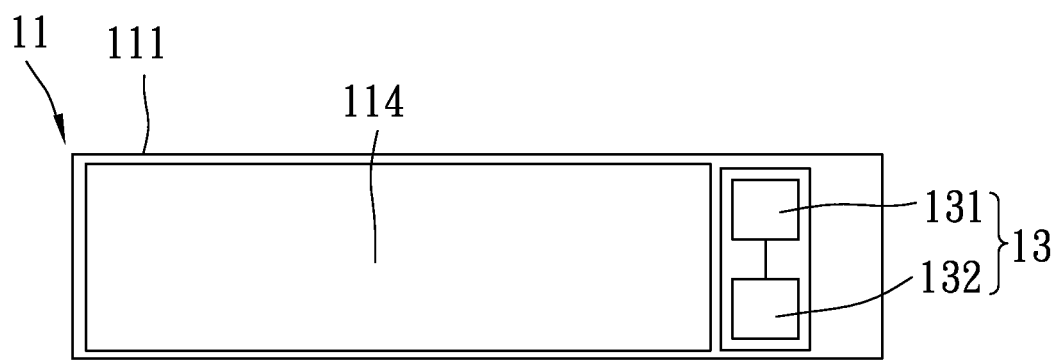
FIG. 4 is a schematic bottom view of the circuit board of the second type of the conventional touch and proximity sensing devices.
Figure 5:
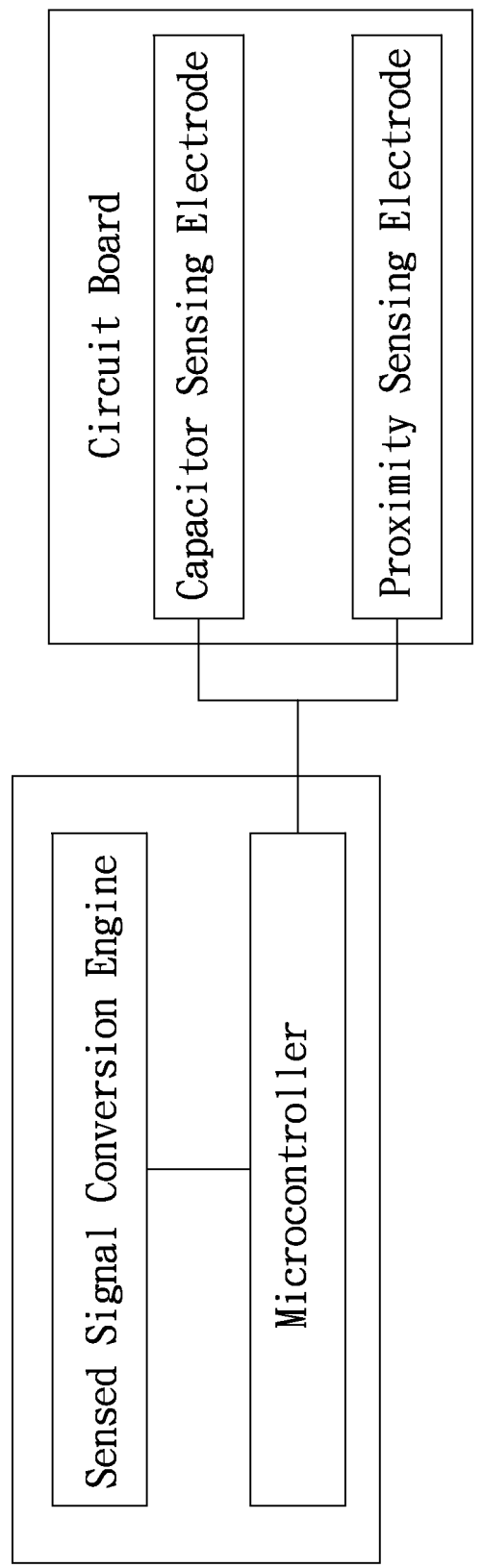
FIG. 5 is a block diagram illustrating the second type of the touch and proximity sensing device.
Figure 6:
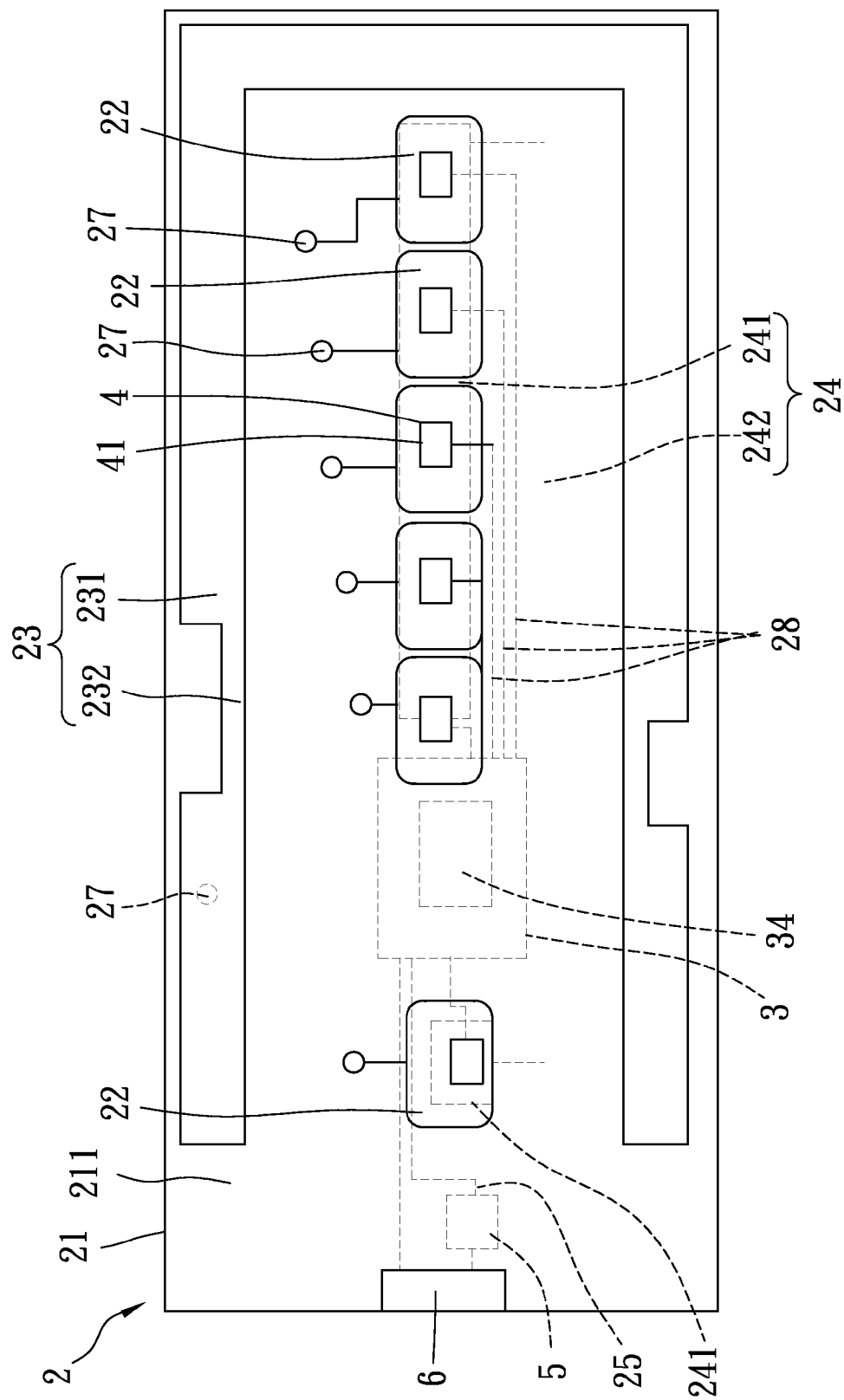
FIG. 6 is a schematic top view of a circuit board of a first preferred embodiment of the touch and proximity sensing device according to the present invention.
Figure 7:
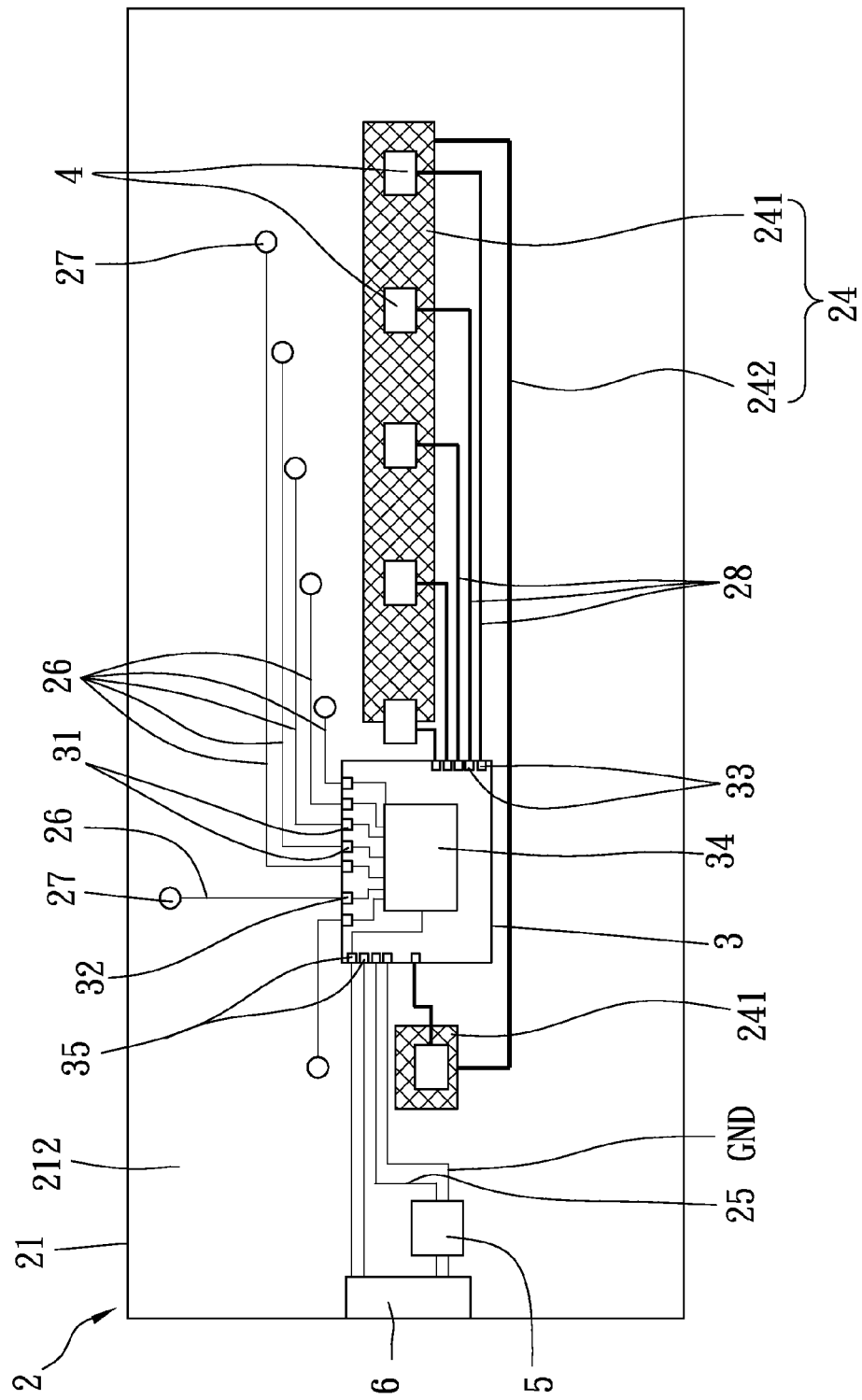
FIG. 7 is a schematic bottom view of the circuit board of the first preferred embodiment.

Referring to FIG. 6 and FIG. 7, the first preferred embodiment of the touch and proximity sensing device according to this invention is shown to include a circuit board 2, a sensed signal processing unit 3, a plurality of light emitting devices 4, a signal connector 5, and an interface connector 6.

The circuit board 2 includes a dielectric substrate 21, a plurality of capacitor sensing electrodes 22, a proximity sensing electrode 23, and a grounding conductor foil 24.

The dielectric substrate 21 has opposite first and second surfaces 211 and 212. In this embodiment, the first surface 211 has a first region for placement of the capacitor sensing electrodes 22 and a second region spaced apart from the first region for placement of the proximity sensing electrode 23. The second surface 212 has a third region for placement of the grounding conductor foil 24. The third region overlaps with a projection of the first region onto the second surface 212. In this embodiment, the dielectric substrate 21 is substantially formed in the shape of a rectangle, but is not limited thereto, and may be formed in the shape of a triangle, a circle, or a polygon depending on requirements. Preferably, the dielectric substrate 21 of the circuit board 2 has a thickness not smaller than 1 mm.

The capacitor sensing electrodes 22 are formed on the first region and spaced apart from each other. In this embodiment, each of the capacitor sensing electrodes 22 is formed of copper foil without any holes thereon.

The proximity sensing electrode 23 is formed on the second region in this embodiment, and surrounds the capacitor sensing electrodes 22 with an open side. When an object (not shown) is located in a sensing range of the proximity sensing electrode 23, the electric field lines above the proximity sensing electrode 23 are thus changed to generate an electric signal on the proximity sensing electrode 23 for detection. The proximity sensing electrode 23 commonly operates with an amplifier (not shown) to amplify the intensity of the electric signal. The preferable sensing range of the proximity sensing electrode 23 is from 1 cm to 10 cm. In this embodiment, the proximity sensing electrode 23 is formed of copper foil without any holes thereon.

The proximity sensing electrode 23 includes a plurality of main portions 231, and at least one connection portion 232 interconnecting electrically an adjacent pair of the main portions 231 and having a width smaller than that of the main portions 231. Preferably, each of the main portions 231 of the proximity sensing electrode 23 has a width not smaller than 1 mm. When the outline of the edge of the dielectric substrate 21 is not smooth, for example, having an indent on a straight extending path of the main portions 231, the connection portion 232 that has a smaller width can be used to interconnect electrically the adjacent pair of the main portions 231. In the first preferred embodiment, the proximity sensing electrode 23 extends along the edge of the dielectric substrate 21 and is formed to have a U shape.

The grounding conductor foil 24 is formed on the third region. Preferably, a distance between the grounding conductor foil 24 and a projection of the proximity sensing electrode 23 onto the second surface 212 is not smaller than 1 mm. As shown in FIGS. 6 and 7, in this embodiment, the capacitor sensing electrodes 22 are divided into first and second sets spaced apart from each other. The third region includes a first sub-region overlapping with a projection of the first set of the capacitor sensing electrodes 22 onto the second surface 212, and a second sub-region spaced apart from the first sub-region and overlapping with a projection of the second set of the capacitor sensing electrodes 22 onto the second surface 212. The sensed signal processing unit 3 is disposed on the second surface 212 between the first and second sub-regions. The grounding conductor foil 24 has first and second patterned foil parts 241 disposed respectively at the first and second sub-regions, and at least one connection part 242 interconnecting electrically the first and second patterned foil parts 241. In this embodiment, each of the first and second patterned foil parts 241 is formed with a plurality of holes and is preferably in a form of a mesh. Preferably, each of the first and second patterned foil parts 241 is formed of a mesh having an angle of 45°.

In detail, a projection of each of the first and second patterned foil parts 241 at the first surface 211 is formed with at least one of the capacitor sensing electrodes 22. When several capacitor sensing electrodes 22 are adjacent to each other without any other electronic devices (e.g., resistors, inductors, transistors, or amplifiers, etc.) disposed therebetween, projection of each of the first and second patterned foil parts 241 at the first surface 211 may be formed with said several capacitor sensing electrodes 22.

Each of the capacitor sensing electrodes 22, the grounding conductor foil 24, and the dielectric substrate 21 between the capacitor sensing electrode 22 and the grounding conductor foil 24 cooperate to form a capacitor.

The sensed signal processing unit 3 is disposed on the dielectric substrate 21 and includes a plurality of capacitance sensing ports 31 coupled to the capacitor sensing electrodes 22, a proximity sensing port 32 coupled to the proximity sensing electrode 23, a plurality of light control ports 33, and only one sensed signal conversion engine 34. The sensed signal conversion engine 34 is coupled to the capacitance sensing ports 31 and the proximity sensing port 32 to detect an electric sensed signal from at least one of the capacitor sensing electrodes 22 and the proximity sensing electrode 23, and to output an output signal based on the electric sensed signal. The output signal indicates a touch sensing of the capacitor sensing electrodes 22 or a sensing of the proximity sensing electrode 23. In this embodiment, the sensed signal conversion engine 34 is disposed at the second surface 212 of the dielectric substrate 21 at a position spaced apart from the third and fourth regions. Since detection of the electric sensed signal and output of the output signal by the sensed signal conversion engine 34 are known to one skilled in the art, details thereof are not described herein.

The sensed signal processing unit 3 further includes a plurality of connection ports 35 for transmitting and receiving electric power and electric signals, such as $V_{DD}$, GND, SDA, SCLD, etc. In the first preferred embodiment, the sensed signal processing unit 3 is a sensing chip.

In this embodiment, a projection of the position at which the sensed signal conversion engine 34 is disposed on the first surface 211 is spaced apart from the capacitor sensing electrodes 22 and the proximity sensing electrode 23, so that normal operation of the sensed signal conversion engine 34 is not easily susceptible to interference attributed to large variation of the electric sensed signal from the capacitor sensing electrodes 22 and the proximity sensing electrode 23. Therefore, in other embodiments, the sensed signal conversion engine 34 may be disposed at the first surface 211 of the dielectric substrate 21 at a position spaced apart from the first and second regions to achieve the same advantage. In addition, the sensed signal conversion engine 34 is coupled to the capacitor sensing electrodes 22 and the proximity sensing electrode 23 through the capacitance sensing ports 31 and the proximity sensing port 32.

The light emitting devices 4 are disposed on the circuit board 2, and each of the light control ports 33 of the sensed signal processing unit 3 is coupled to a corresponding light emitting device 4. In this embodiment, each of the light emitting devices 4 is a light emitting diode, and extends from the second surface 212 to be exposed from the first surface 211. In other embodiments, the light emitting devices 4 may be light bulbs. Each of the light emitting devices 4 has a light exiting surface 41 facing in a same direction as the first surface 211 of the dielectric substrate 21. Each of the capacitor sensing electrodes 22 corresponds to at least one of the light emitting devices 4. In the first preferred embodiment, one of the capacitor sensing electrodes 22 corresponds to two light emitting devices 4 that emit lights with different ranges of wavelength, and the other capacitor sensing electrodes 22 respectively correspond to one light emitting device 4.

The signal connector 5 is disposed on the second surface 212 of the dielectric substrate 21 for transmission of the electric power and electric signals (e.g., $V_{DD}$, GND, SDA, SCLK, etc.) from the interface connector 6 to the sensed signal processing unit 3.

The interface connector 6 is disposed on a side of the circuit board 2, and is coupled to the signal connector 5 and the sensed signal processing unit 3 for transmission of electric signal from the sensed signal processing unit 3 to an external circuit.

In the first preferred embodiment, the circuit board 2 further includes a power line 25 formed on the second surface 212 of the dielectric substrate 21 for electric power transmission to the sensed signal processing unit 3, a grounding line GND, a plurality of sensing lines 26 formed on the second surface 212 of the dielectric substrate 21, a plurality of vias 27 extending through the dielectric substrate 21 and interconnecting electrically the sensing lines 26 and the capacitor and proximity sensing electrodes 22, 23, and a plurality of signal lines 28 formed on the second surface 212 of the dielectric substrate 21 for coupling the light emitting devices 4 to the light control ports 33. The sensing lines 26 are coupled to the capacitance sensing ports 31 and the proximity sensing port 32 for transmission of the electric sensed signal from the capacitor sensing electrodes 22 and the proximity sensing electrode 23 to the sensed signal conversion engine 34. Since the voltages transmitted on the power line 25 and the signal lines 28 are relatively large, it is designed that a projection of the proximity sensing electrode 23 onto the second surface 212 is spaced apart from the power line 25 and the signal lines 28. Preferably, a distance between the projection of the proximity sensing electrode 23 onto the second surface 212 and any one of the power line 25 and the signal lines 28 is not smaller than 1 mm.

Figure 8:
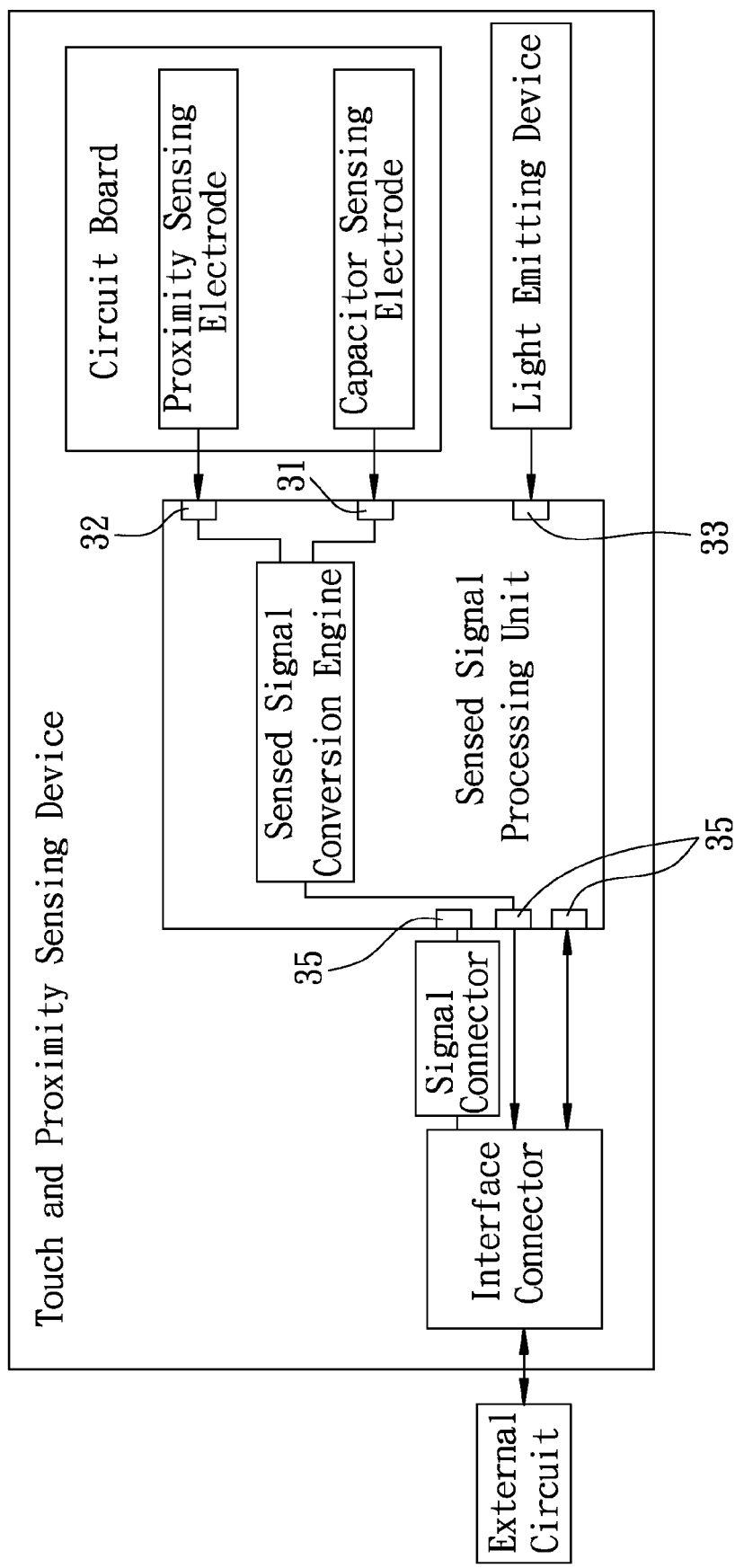
FIG. 8 is a block diagram illustrating the touch and proximity sensing device according to the present invention.

Further referring to FIG. 8, electric power and electric signals from the external circuit (e.g., a single chip for controlling USB devices, solid state drives, or image scaling on the screens, etc.) are transmitted to the sensed signal processing unit 3 through the interface connector 6 and the signal connector 5, and an initial value is thus written to the sensed signal processing unit 3. When an object (e.g., a finger or a conductor rod) is located in the sensing range of the proximity sensing electrode 23, the electric field lines above the proximity sensing electrode 23 are thus affected. Then, an electric non-touch sensed signal is generated at the proximity sensing electrode 23 and is transmitted to the sensed signal conversion engine 34 through the sensing lines 26 and the vias 27. When the sensed signal conversion engine 34 detects the electric non-touch sensed signal and determines the magnitude of the electric non-touch sensed signal is greater than a threshold value, the sensed signal conversion engine 34 generates the output signal that indicates the proximity sensing electrode 23 has sensed something to the external circuit. After the external circuit receives the output signal from the sensed signal conversion engine 34, the external circuit provides a signal associated with execution process of driving the light emitting devices 4 to the sensed signal processing unit 3 through the interface connector 6 for driving the light emitting devices 4.

When an object touches any one of the capacitor sensing electrodes 22, the capacitance associated with the touched capacitor sensing electrode 22 is thus affected. Then, an electric touch sensed signal is generated at the touched capacitor sensing electrode 22 and is transmitted to the sensed signal conversion engine 34 through the sensing lines 26 and the vias 27. When the sensed signal conversion engine 34 detects the electric touch sensed signal and determines that the magnitude of the electric touch sensed signal is greater than a threshold value, the sensed signal conversion engine 34 generates the output signal that indicates the capacitor sensing electrode 22 has been touched to the external circuit. After the external circuit receives the output signal from the sensed signal conversion engine 34, the external circuit provides a signal associated with execution process of driving the light emitting devices 4 to the sensed signal processing unit 3 through the interface connector 6 for driving the light emitting devices 4.

It should be noted that the first preferred embodiment receives a signal associated with execution process from the external circuit to drive the light emitting devices 4. In other embodiments, other devices may be used to replace the light emitting devices 4, such as speakers.

The first preferred embodiment makes it possible to use a single sensed signal conversion engine 34 to process the electric sensed signals from the capacitor sensing electrodes 22 and the proximity sensing electrode 23 at the same time by: (1) projection of the grounding conductor foil 24 at the first surface 211 being spaced apart from the proximity sensing electrode 23; and (2) projection of the sensed signal conversion engine 34 at the first surface 211 being spaced apart from the capacitor sensing electrodes 22 and the proximity sensing electrode 23. Therefore, the first preferred embodiment may operate without an additional microcontroller or two sensed signal conversion engines for independently processing the signals from the capacitor sensing electrodes and the proximity sensing electrode as taught in the prior art, and the electric sensed signals from the capacitor sensing electrodes 22 and the proximity sensing electrode 23 do not interfere with each other and do not interfere with normal operation of the sensed signal conversion engine 34.

Since the proximity sensing electrode 23 of the first preferred embodiment has the wider main portions 231, whose projections onto the second surface 212 are spaced apart from the pattered foil parts 241 of the grounding conductor foil 24, interference of the grounding conductor foil 24 on electric field lines of the proximity sensing electrode 23 may be reduced and sensitivity of proximity sensing may be enhanced.

Since the power line 25 and the signal lines 28 that transmit signals with relatively higher voltages are designed to be spaced apart from the proximity sensing electrode 23 by at least 1 mm, interference of the power line 25 and the signal lines 28 on electric field lines of the proximity sensing electrode 23 may be reduced.

Since the patterned foil parts 241 of the grounding conductor foil 24 are formed with holes, interference on electric field lines of the proximity sensing electrode 23 resulting from large electric field between the proximity sensing electrode 23 and the grounding conductor foil 24 may be alleviated. Since the patterned foil parts 241 are electrically connected to each other, the ground level is uniform.

It should be noted that, in other embodiments, the circuit board 2 may include only one capacitor sensing electrode 22, and the sensed signal processing unit 3 includes a capacitance sensing port 31 corresponding to the capacitor sensing electrode 22 for transmitting the electric touch sensed signal to the sensed signal conversion engine 34. In this case, the grounding conductor foil 24 has a patterned foil part 241 corresponding to the capacitor sensing electrode 22.

Figure 9:
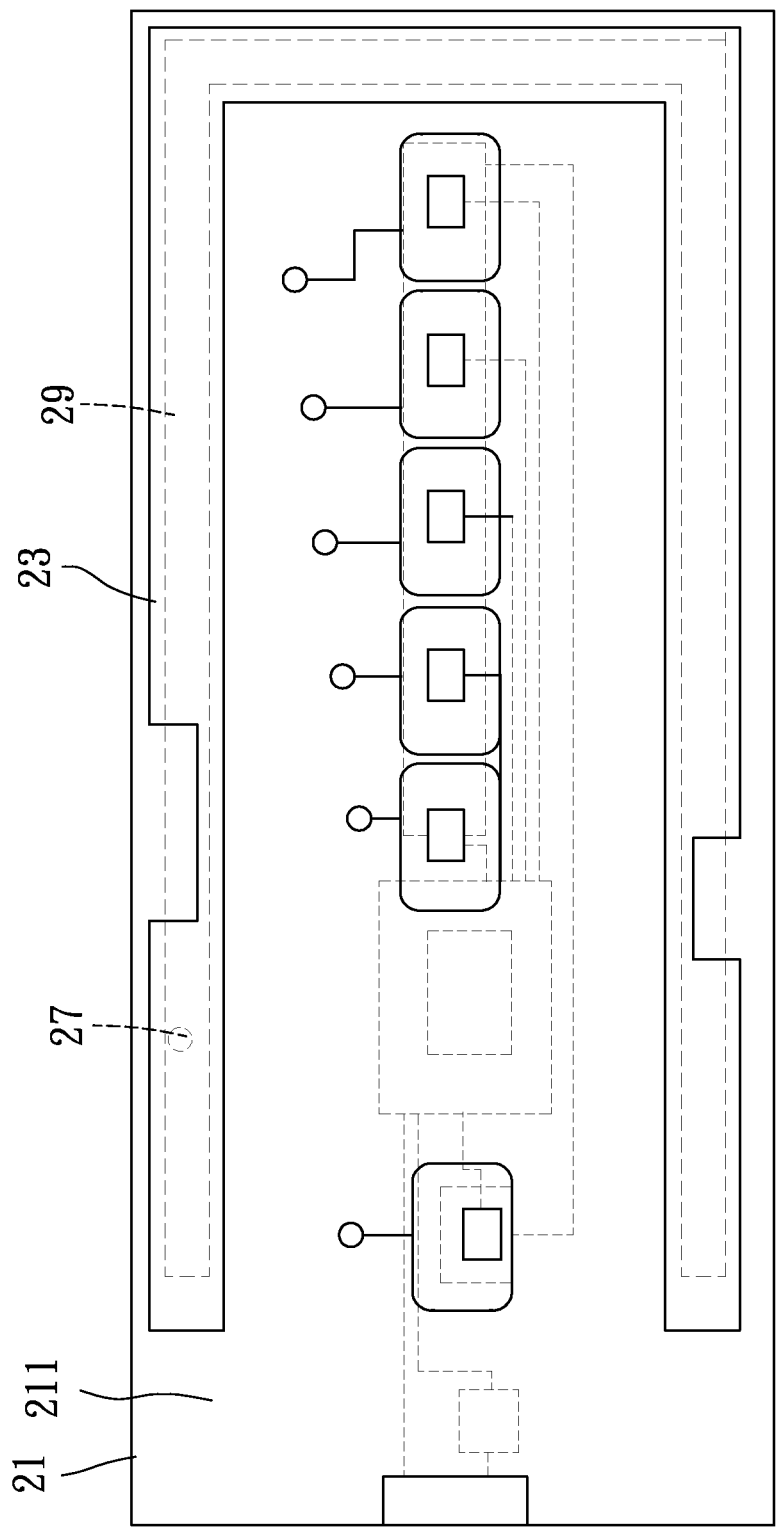
FIG. 9 is a schematic top view of a circuit board of a second preferred embodiment of the touch and proximity sensing device according to the present invention.
Figure 10:
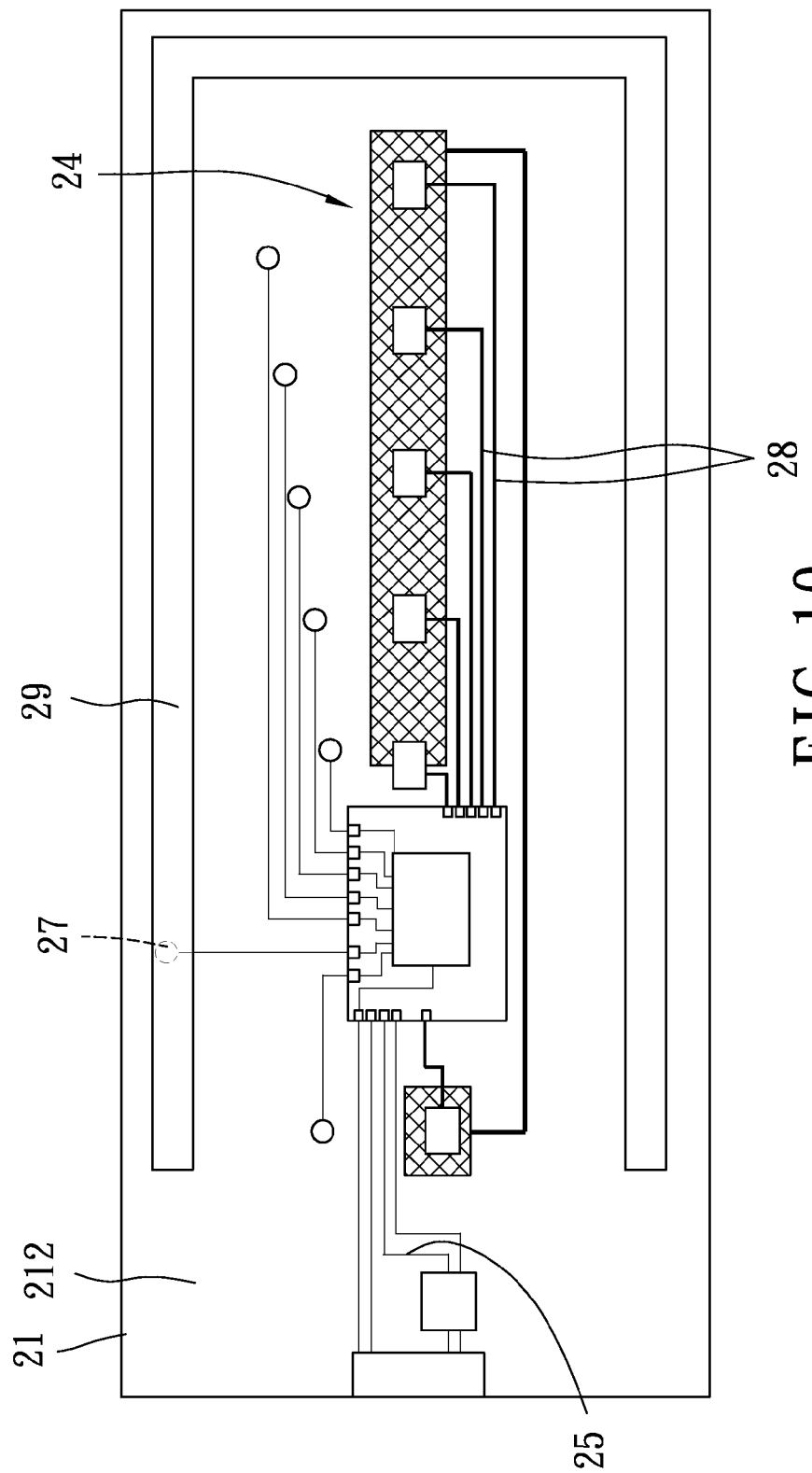
FIG. 10 is a schematic bottom view of the circuit board of the second preferred embodiment.

Referring to FIG. 9 and FIG. 10, a second preferred embodiment of the touch and proximity sensing device according to this invention is shown to be similar to the first preferred embodiment. Difference with the first preferred embodiment resides in that the second surface 212 of the dielectric substrate 21 of the circuit board 2 further has a fourth region spaced apart from the third region, and the fourth region overlaps with a projection of the second region onto the second surface 212. The circuit board 2 further includes an auxiliary proximity sensing electrode 29 formed on the fourth region and coupled electrically to the proximity sensing electrode 23 through the vias 27. Preferably, a distance between the grounding conductor foil 24 and the auxiliary proximity sensing electrode 29 is not smaller than 1 mm, and a distance between the auxiliary proximity sensing electrode 29 and any one of the power line 25 and the signal lines 28 is not smaller than 1 mm.

Operation of the second preferred embodiment is similar to that of the first preferred embodiment. In addition, the second preferred embodiment uses the auxiliary proximity sensing electrode 29 to enhance sensitivity of proximity sensing and to reduce interference of the grounding conductor foil 24 on electric field lines for proximity sensing.

Furthermore, the first and second preferred embodiments may include a cover plate (not shown) covering the circuit board 2, and adhesive. The cover plate is made of insulator material, such as glass or plastic, and is connected to the circuit board 2 by the adhesive, which is insulator adhesive, such as double-sided adhesive tape.

For describing operation of the present invention, an implementation of the second preferred embodiment is illustrated hereinafter.

The circuit board is a double layer printed circuit board, which is substantially formed in the shape of a rectangle. The circuit board has a dielectric substrate with a length of 130 mm, a width of 12 mm, and a thickness of 1.6 mm. The dielectric substrate has opposite first and second surfaces. The first surface has a first region and a second region spaced apart from the first region, and the second surface has a third region and a fourth region spaced apart from the third region. The third region overlaps with a projection of the first region onto the second surface, and the fourth region overlaps with a projection of the second region onto the second surface.

There are six capacitor sensing electrodes formed on the first region and a proximity sensing electrode formed on the second region. The proximity sensing electrode has main portions each with a width of 1.5 mm. The main portions of the proximity sensing electrode are respectively disposed proximate to the long edges and one of the short edges of the dielectric substrate. The adjacent pair of main portions are electrically connected with a connection portion, which is formed at a position corresponding to an indent portion of the corresponding long edge. Therefore, the proximity sensing electrode is formed of a U shape. The sensing range of the proximity sensing electrode is from 1 cm to 10 cm according to size of the object to be sensed.

The grounding conductor foil is formed on the third region of the second surface of the dielectric substrate, and the third region has first and second sub-regions spaced apart from each other. The capacitor sensing electrodes are divided into first and second sets which respectively include five and one of the capacitor sensing electrodes and are respectively disposed at projections of the first and second sub-regions of the third region onto the first surface. The grounding conductor foil has first and second patterned foil parts disposed respectively at the first and second sub-regions, and a connection part interconnecting electrically the first and second patterned foil parts.

There are a power line, sensing lines, and signal lines formed on the second surface of the dielectric substrate. Projection of each of the power line and the signal lines onto the first surface is spaced apart from the proximity sensing electrode.

There are light emitting devices respectively disposed at positions corresponding to the capacitor sensing electrodes, and each of the light emitting devices has a light exiting surface facing in a same direction as the first surface of the dielectric substrate. In this implementation, five of the light emitting devices include only one light emitting diode, and the other one of the light emitting devices includes two light emitting diodes.

There is a signal connector disposed on the circuit board for transmission of electrical power ($V_{CC}$, $V_{DD}$), ground level (GND), and electric signals associated with execution process (SDA, SCLK).

There is an interface connector that includes an I²C bus and that is disposed adjacent to an edge of the circuit board.

There is a sensed signal processing unit, which is a button signal processing chip (Model no. SB3584, designed by ENETECHNOLOGY) and includes 25 ports. The button signal processing chip is integrated with a buffer for storing electric signals and function settings of general purpose inputs/outputs (GPIO). The button signal processing chip includes 13 sensing ports, 11 connection ports, and an interrupt port. The interrupt port transmits electric signal to external circuits through the I²C bus. The sensing ports are respectively coupled to the proximity sensing electrode (proximity sensing port), the six capacitor sensing electrodes (capacitance sensing ports), and the light emitting devices (light control ports). Some of the remaining ports are coupled to resistors and capacitors for adjustment of sensing sensitivity, and some of the remaining ports are coupled to the signal connector and the I²C bus for transmitting and receiving electric power, ground level, and signal from the external circuits.

When the sensing ports detect signal indicating a sensing event, the interrupt port is switched from a high voltage level to a low voltage level to inform the external circuit of the sensing event. The external circuit knows which electrode is triggered by reading the buffer of the sensing chip, and executes the associated process.

When the external circuit is activated, electric power is transmitted to the button signal processing chip through the I²C bus and the signal connector, and initial values of the activated external circuit are written into the buffer of the button signal processing chip through the I²C bus, so as to activate the capacitor sensing electrodes and the proximity sensing electrode, and to complete parameter settings of GPIO to drive the light emitting devices upon receipt of electric signals.

When an object is located in a sensing range of the proximity sensing electrode and the auxiliary proximity sensing electrode, the sensed signal conversion engine of the button signal processing chip sends an interrupt (INT) signal to the external circuit. When the external circuit is informed that a proximity sensing is triggered, the external circuit generates commands associated with execution process for simultaneously driving the light emitting devices, and sends the commands to the buffer of the button signal processing chip through the I²C bus. Then, the light emitting devices are simultaneously driven to emit light according to the program stored in the buffer. When the object is removed from the sensing range of the proximity sensing electrode and the auxiliary proximity sensing electrode, the light emitting devices are turned off.

When the object is located in the sensing range of the proximity sensing electrode and the auxiliary proximity sensing electrode and is approaching one of the capacitor sensing electrodes, the sensed signal conversion engine of the button signal processing chip sends an INT signal to the external circuit, and the voltage level of the interrupt port is converted from high to low to inform the external circuit. Upon receipt of the INT signal, the external circuit clears a pending flag of the button signal processing chip via the I²C bus to release the interrupt port from the low voltage level back to the high voltage level, and reads an electric signal indicating a state of "an object is disposed in the sensing range of the proximity sensing" in the button status register of the button signal processing chip, so as to know that the proximity sensing is triggered. Then, when the object touches one of the capacitor sensing electrodes, the sensed signal conversion engine sends a next INT signal to the external circuit. In addition to clearing the pending flag of the button signal processing chip via the I²C bus for converting voltage level of the interrupt port from low to high, the sensed signal conversion engine reads an electric signal indicating a state of "the capacitor sensing electrode has been touched" in the button status register of the button signal processing chip, so as to know which capacitor sensing electrode has been touched. Then, a command associated with execution process for driving a single light emitting device is generated and sent to the buffer of the button signal processing chip. The light emitting device corresponding to the touched capacitor sensing electrode is thus driven to emit light according to the program stored in the buffer, while the other light emitting devices are turned off.

To sum up, in this invention, the grounding conductor foil is spaced apart from the proximity sensing electrode in a planar direction, and the sensed signal conversion engine is spaced apart from the proximity sensing electrode and the capacitor sensing electrodes in the planar direction. In addition, the power line and the signal lines are spaced apart from the proximity sensing electrode in the planar direction, so that a single sensed signal conversion engine can simultaneously process signals from the proximity sensing electrode and the capacitor sensing electrodes without interference from each other.

While the present invention has been described in connection with what are considered the most practical and preferred embodiments, it is understood that this invention is not limited to the disclosed embodiments but is intended to cover various arrangements included within the spirit and scope of the broadest interpretation so as to encompass all such modifications and equivalent arrangements.

What is claimed is:

1. A touch and proximity sensing device comprising:
   a circuit board including:
      a dielectric substrate having opposite first and second surfaces, said first surface having a first region and a second region spaced apart from said first region, said second surface having a third region and a fourth region spaced apart from said third region, said third region overlapping with a projection of said first region onto said second surface, said fourth region overlapping with a projection of said second region onto said second surface;
      at least one capacitor sensing electrode formed on said first region;
      a grounding conductor foil formed on said third region; and
      a proximity sensing electrode formed on one of said second and fourth regions; and
   a sensed signal processing unit disposed on said dielectric substrate and including:
      at least one capacitance sensing port coupled to said capacitor sensing electrode;
      a proximity sensing port coupled to said proximity sensing electrode; and
      a sensed signal conversion engine coupled to said capacitance sensing port and said proximity sensing port and operable to detect an electric sensed signal from at least one of said capacitor sensing electrode and said proximity sensing electrode, and to output an output signal based on the electric sensed signal;
   wherein said sensed signal conversion engine is disposed at one of:
      said first surface of said dielectric substrate at a position spaced apart from said first and second regions; and
      said second surface of said dielectric substrate at a position spaced apart from said third and fourth regions.

2. The touch and proximity sensing device as claimed in claim 1, wherein said proximity sensing electrode is formed on said second region, and said circuit board further includes an auxiliary proximity sensing electrode formed on said fourth region and coupled electrically to said proximity sensing electrode.

3. The touch and proximity sensing device as claimed in claim 2, wherein a distance between said grounding conductor foil and any one of said auxiliary proximity sensing electrode and a projection of said proximity sensing electrode onto said second surface is not smaller than 1 mm.

4. The touch and proximity sensing device as claimed in claim 1, wherein said proximity sensing electrode is formed on said second region, and a distance between said grounding conductor foil and a projection of said proximity sensing electrode onto said second surface is not smaller than 1 mm.

5. The touch and proximity sensing device as claimed in claim 1, wherein said proximity sensing electrode includes a plurality of main portions each having a width not smaller than 1 mm, and at least one connection portion interconnecting electrically an adjacent pair of said main portions and having a width smaller than that of said main portions.

6. The touch and proximity sensing device as claimed in claim 1, wherein said circuit board includes first and second sets of said capacitor sensing electrodes, said third region including a first sub-region overlapping with a projection of said first set of said capacitor sensing electrodes onto said second surface, and a second sub-region overlapping with a projection of said second set of said capacitor sensing electrodes onto said second surface, said grounding conductor foil having first and second patterned foil parts disposed respectively at said first and second sub-regions, and at least one connection part interconnecting electrically said first and second patterned foil parts.

7. The touch and proximity sensing device as claimed in claim 6, wherein said first and second sub-regions are spaced apart from each other and said sensed signal processing unit is disposed on said second surface between said first and second sub-regions.

8. The touch and proximity sensing device as claimed in claim 6, wherein each of said first and second patterned foil parts is formed with a plurality of holes.

9. The touch and proximity sensing device as claimed in claim 8, wherein each of said first and second patterned foil parts is in a form of a mesh.

10. The touch and proximity sensing device as claimed in claim 1, further comprising at least one light emitting device disposed on said circuit board, said light emitting device having a light exiting surface facing in a same direction as said first surface of said dielectric substrate, said sensed signal processing unit further including at least one light control port coupled to said light emitting device.

11. The touch and proximity sensing device as claimed in claim 10, wherein said circuit board further includes a power line formed on said second surface of said dielectric substrate for electric power transmission to said sensed signal processing unit, at least one sensing line formed on said second surface of said dielectric substrate and coupled to said capacitance sensing port, at least one via extending through said dielectric substrate and interconnecting electrically said sensing line and said capacitor sensing electrode, and at least one signal line formed on said second surface of said dielectric substrate for coupling said light emitting device to said light control port.

12. The touch and proximity sensing device as claimed in claim 11, wherein said proximity sensing electrode is formed on said second region, and a distance between a projection of said proximity sensing electrode onto said second surface and any one of said power line and said signal line is not smaller than 1 mm.

13. The touch and proximity sensing device as claimed in claim 11, further comprising a signal connector for transmission of electric power and electric signals to said sensed signal processing unit, and an interface connector for transmission of electric signals from said sensed signal processing unit to an external circuit.

14. The touch and proximity sensing device as claimed in claim 1, wherein said dielectric substrate of said circuit board has a thickness not smaller than 1 mm.

15. A circuit board adapted for placement of a sensed signal processing unit thereon, the sensed signal processing unit including a capacitance sensing port and a proximity sensing port for touch and proximity sensing, said circuit board comprising:
- a dielectric substrate having opposite first and second surfaces, said first surface having a first region and a second region spaced apart from said first region, said second surface having a third region and a fourth region spaced apart from said third region, said third region overlapping with a projection of said first region onto said second surface, said fourth region overlapping with a projection of said second region onto said second surface;
- at least one capacitor sensing electrode formed on said first region and to be coupled to the capacitance sensing port;
- a grounding conductor foil formed on said third region;
- a proximity sensing electrode formed on said second region and to be coupled to the proximity sensing port; and
- an auxiliary proximity sensing electrode formed on said fourth region and to be coupled to the proximity sensing port.

16. The circuit board as claimed in claim 15, wherein a distance between said grounding conductor foil and any one of said auxiliary proximity sensing electrode and a projection of said proximity sensing electrode onto said second surface is not smaller than 1 mm.

17. The circuit board as claimed in claim 15, wherein a distance between said grounding conductor foil and a projection of said proximity sensing electrode onto said second surface is not smaller than 1 mm.

* * * * *